United States Patent Office 3,237,024

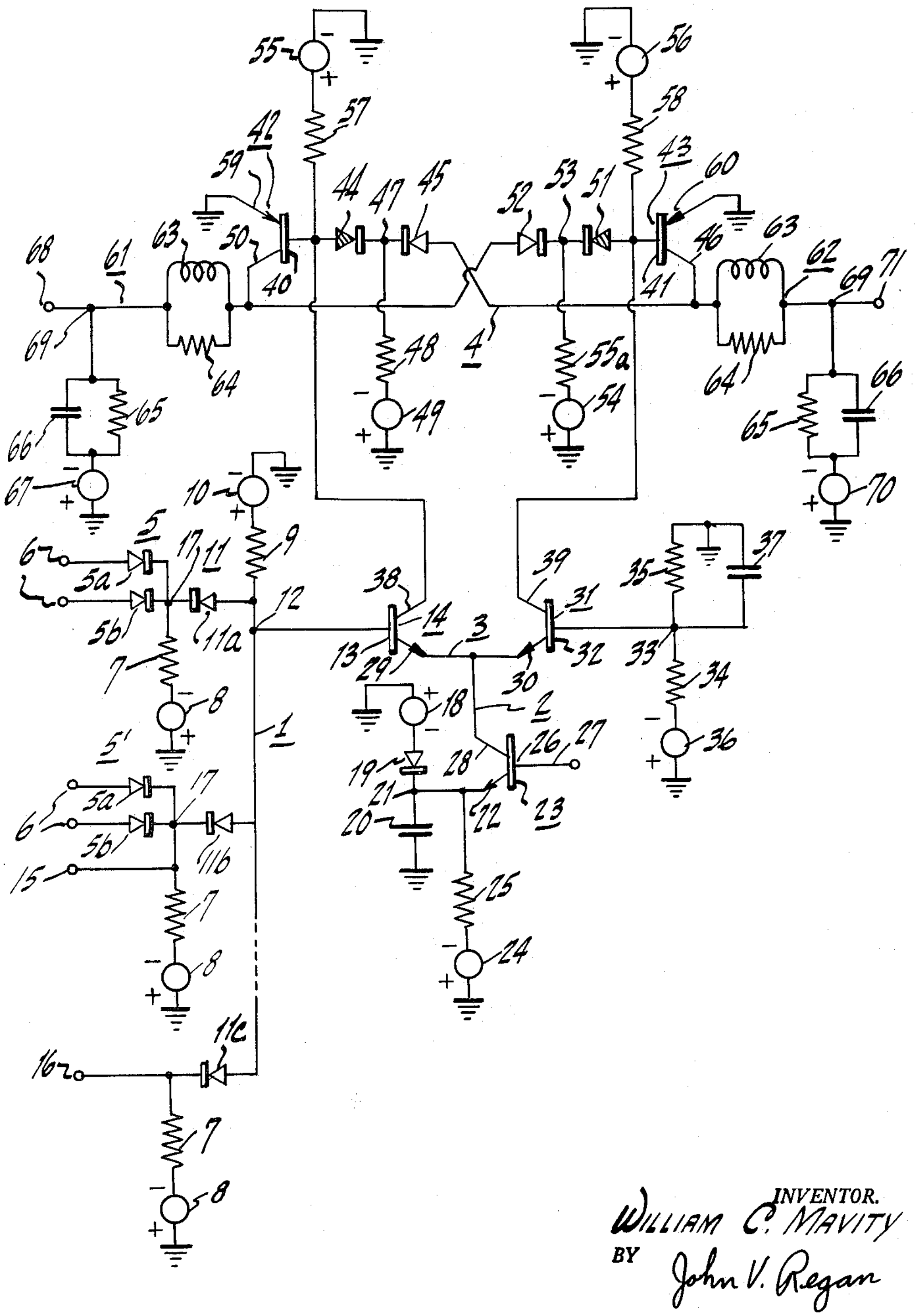
INVENTOR.
WILLIAM C. MAVITY
BY John V. Regan
Attorney

Patented Feb. 22, 1966

3,237,024

LOGIC CIRCUIT

William C. Mavity, Van Nuys, Calif., assignor to Radio Corporation of America, a corporation of Delaware Filed May 22, 1962, Ser. No. 196,775
4 Claims. (Cl. 307—88.5)

This invention relates to a logic circuit and more particularly to a universal logic element that provides gating, memory, inversion and synchronization of input data signals over a wide range of frequencies.

It is an object of this invention to provide an improved logic circuit which can operate at high speed, for example, at data rates up to 30 megacycles per second.

It is an object to provide an improved logic circuit which can operate at high speed, and which is inherently noise insensitive.

It is an object to provide a logic circuit including a bistable multivibrator in which feedback from other parts of the circuit will not cause improper operation of the bistable multivibrator.

The circuit of this invention as exemplified herein comprises a plurality of diode gate circuits and means for applying the output of the diode gates to one or the other of the inputs of a bistable multivibrator or flip-flop circuit under the control of a clock pulse. The circuit may also include a filter between each output of the flip-flop circuit and the circuit element controlled thereby, said filter delaying the peak of the produced output wave long enough so that the clock pulse has ended before the output pulse arrives at the voltage necessary to cause control of further logic elements.

This invention may be better understood by reference to the following detailed description thereof taken with the single figure of the drawing, which illustrates the invention.

The single figure shows the combination of a plurality of diode gate circuits 1, a strobe or clock pulse circuit 2, a current gate circuit 3, and a flip-flop circuit 4 connected in the manner to be described.

The diode gates comprise "or" gates 5 and 5′ driving an "and" gate 11. The "or" gate diodes *5a* and *5b* each connect a respective input terminal 6 through a common resistor 7 to a source of direct potential 8, the diodes thereby being poled to be biased in their conducting direction, the other terminal of source 8 being connected to the common ground connection. The outputs of the "or" gates 5 and 5′ at junctures 17 are each connected to a separate diode *11a* or *11b* of the "and" gate 11. Resistor 9 connects a direct potential source 10 of the opposite polarity to source 8 through the "and" circuit diodes *11a* and *11b* to the terminals of diodes *5a* and *5b* that are connected to resistors 7. Each "and" circuit diode *11a* and *11b* is poled to be biased in its conducting direction by source 10, the other terminal of the source 10 being connected to the common ground connection. The junction 12 of resistor 9 and the diodes *11a* and *11b* is the output of the "and" gate, and is connected to an input of the current gate 3, as will be described. For convenience of drawing, each of the two diode "or" gates is shown as having two inputs. However, a third terminal 15 is provided in the second "or" gate circuit which may be used with an externally provided diode (not shown). A still further input 16 to the diode "and" gate 11 and including diode *11c* may also be used.

The strobe or clock circuit 2 comprises a diode 19 connecting one terminal of a source of direct potential 18 to a like terminal of a source of direct potential 24 through a resistor 25 in such manner that diode 19 is forward biased, the remaining terminals of sources 18 and 24 being grounded. Junction 21 of diode 19 and resistor 25 is also common with emitter 22 of a transistor (electron device) 23 and a terminal of capacitor 20, the other terminal of capacitor 20 being connected to ground. The clock circuit 2 is operative with the capacitor 20 included therein as described, or with the capacitor omitted, the circuit connections otherwise being unchanged. Capacitor 20 may be included to reduce the power dissipation of clock circuit 2. A clock pulse is applied to the base 26 of transistor 23 by way of a connector 27. The collector 28 of transistor 23, which comprises the output of the strobe circuit 2, is connected to an input of the current gate or current transfer circuit 3 to be described.

The current gate 3 comprises transistors (electron devices) 14 and 31, whose emitters 29 and 30 are connected together and to the output element, the collector 28, of strobe circuit 2. The base 32 of transistor 31 is connected to the junction 33 of resistors 34 and 35. One terminal of a source of direct potential 36 (the other terminal of which is grounded) is connected through resistors 34 and 35 to ground and a capacitor 37 is connected between ground and the junction 33. The output of gate circuit 1 which appears at junction 12 is connected to the base 13 of transistor 14. The collectors 38 and 39 of transistors 14 and 31 are individually connected to the input terminals of the flip-flop circuit 4, to be described.

The flip-flop circuit 4 comprises a transistor (electron device) 42, the base 40 of which is connected through a pair of oppositely poled diodes 44 and 45 to the collector 46 of a further transistor (electron device) 43. The junction 47 of diodes 44 and 45 is connected through resistor 48 to a terminal of a source of direct potential 49, the other terminal of which is grounded. Similarly, the base 41 of transistor 43 is connected to the collector 50 of transistor 42 through oppositely poled diodes 51 and 52 in series. The junction 53 of diodes 51 and 52 is connected to a terminal of a source of direct potential 54 through resistor *55a*, the other terminal of source 54 being grounded. Diodes 44 and 51 are silicon diodes having a higher conduction threshold than germanium diodes 45 and 52 for a purpose to be explained. While shown as single diodes, in actual practice, each diode 44 and 51 may be three silicon diodes in series. Diodes 44, 45, 51 and 52 are poled to be biased in their conducting direction by sources 49 and 54. Like terminals of sources of potential 55 and 56 are connected to bases 40 and 41 of transistors 42 and 43 through resistors 57 and 58, respectively, the other terminals of these sources being grounded. The emitters 59 and 60 of transistors 42 and 43 are connected to the common ground. Sources of potential 55 and 56 are opposite in polarity to potential sources 49 and 54. The outputs of current gate 3 are applied from the output elements thereof comprising collectors 38 and 39 by individual connectors to the bases 40 and 41, respectively, of the flip-flop transistors 42 and 43.

The outputs of the described flip-flop circuit 4 are taken respectively from collectors 50 and 46, through respective filter circuits 61 and 62. These filter circuits 61 and 62 are substantially identical and therefore only one is described in detail. The filter circuit 61 comprises the series connection of an inductor 63 and a resistor 64 connected in parallel, and a resistor 65 and a capacitor 66 also connected in parallel. One end of filter circuit 61, comprising the joined other ends of inductor 63 and resistor 64, is connected to collector 50, and the other end of filter circuit 61 comprising the joined other ends of capacitor 66 and resistor 65, is connected to one terminal of direct potential source 67, the other terminal of source 67 being grounded. Output connection 68 is connected to the junction 69 of the two described parallel circuits. Similar reference characters have been applied to the similar elements of filter 62, filter 62 being similarly connected between collector 46 and one terminal of a source 70, the other terminal of which is grounded. An output terminal 71 is connected to the junction 69 in filter circuit 62.

The diodes described and shown in the drawing may be any elements having rectifying properties and the transistors may be any suitable electron devices having input, reference and output electrodes. The conventional showing has been used for the diodes whereby the diode is in its low resistance condition when the triangles are positive with respect to the crossline. While, as stated above, diodes 44 and 51 are of silicon, which has a higher threshold value of conduction than the germanium diodes 45 and 52, all other diodes shown may be either all silicon or all germanium diodes. The silicon diodes used herein must have a short enough reverse recovery time to permit the desired speed of operation of this circuit. In accordance with the conventional showing, transistors 14, 23 and 31 are NPN transistors while transistors 42 and 43 are PNP transistors. When using such transistors and diodes poled as shown and described, the voltage of bias sources 8, 24, 49 and 54 is negative, the voltage of sources 36, 67 and 70 is negative but of a lesser magnitude while the voltage at sources 10, 55 and 56 is positive. It will be understood that opposite polarities of supply voltages may be used, with different poling of the diodes and with transistors of opposite types from those illustrated.

The operation of the above-described circuit is as follows: When a zero voltage, which may correspond to a "1" input level, is applied to any of the inputs 6 of an "or" gate 5, or 5′, a voltage of approximately zero volts appears at junction 17 of the diodes 5*a* and 5*b* included in the gate 5 or 5′. When a negative voltage, which may correspond to a "0" input level, is applied to all of the inputs 6 of an "or" gate 5 or 5′, the voltage appearing at junction 17 of that gate becomes approximately equal to the negative input voltage.

The voltage at each point 17 is transferred through its diode 11*a* or 11*b* (or 11*c*, if used) to the point 12, and point 12 in "and" circuit 11 assumes the more negative of the voltages at the several points 17. Thereby, a negative voltage appears at point 12 unless an input of zero level is applied to at least one input terminal of both gates 5 and 5′. The voltage appearing at junction 12 is applied to current gate or transfer circuit 3, which is controlled by strobe circuit 2.

In the strobe circuit 2, the transistor 23 normally is biased to cut-off by the voltages applied thereto. A clock, whose quiescent voltage is normally negative applies a positive-going pulse to base 26 through conductor 27, of such amplitude and duration as to render the transistor 23 conductive for a short period. As noted above, capacitor 20 may be omitted, but if included, the capacitor 20 which had been charged negatively by the source 24 through resistor 25, discharges through the conductive transistor 23 thereby reducing power supplied to the transistor 23 from source 24 and also reducing the power dissipated in resistor 25. If capacitor 20 is omitted, upon rendering transistor 23 conductive, current flows from source 24 through transistor 23. The output of strobe circuit 2 is applied in parallel to the emitters 29 and 30 of transistors 14 and 31 of the current gate 3.

In the current gate 3, a constant predetermined reference voltage is applied to base 32 of transistor 31 from juncture 33, however, a voltage that varies above and below this reference voltage is applied to base 13 of transistor 14 from juncture 12. When this juncture voltage on the base 13 is positive with respect to the reference voltage on base 31, transistor 14 becomes conductive and the clock pulse actuated output from strobe circuit 2 is applied to base 40 in flip-flop circuit 4 through the emitter to collector path of transistor 14. If, however, the voltage on base 13 is negative with respect to the reference voltage on base 32, the emitter and collector path of transistor 14 is virtually open-circuited, and the clock pulse actuated output is applied to base 41 of transistor 43 in flip-flop circuit 4.

In the flip-flop circuit 4, the voltage appearing at collector 50 of transistor 42 is applied through diodes 52 and 51 to the base 41 of transistor 43 and in such direction as to apply a cut-off control voltage to transistor 43 if transistor 42 is in its conducting state. Conversely, when transistor 43 is conductive, cut-off bias is applied to transistor 42 through diodes 45 and 44 in series. As noted above, diodes 44 and 51 are silicon diodes having a higher threshold of conduction than germanium diodes 45 and 52.

As stated, either transistor 42 or 43 is conductive but they are not both conductive (except perhaps transiently) at the same time. Assuming that transistor 42 is conductive, collector 50 thereof is then at ground potential and current flows through diode 52 and resistor 55*a*. Diode 51 is biased in a conductive direction from positive source 56 through resistor 58 and current flows through resistor 58, diode 51 and resistor 55*a*, applying a sufficiently low positive bias to base 41 of transistor 43 as to bias it to cut-off, whereby the voltage on collector 46 falls to the negative voltage applied thereto through filter circuit 62. This collector 46 voltage is applied through oppositely poled germanium diode 45 to reverse bias it, whereby the voltage on base 40 is that due to the flow of current caused by sources 49 and 55. This voltage due to sources 49 and 55 is such as to forward bias transistor 42 to a value sufficient to hold transistor 42 conductive. Silicon diode 44 (actually, as stated above, three diodes in series) is biased in the conductive direction by voltage source 55 through resistor 57 and exhibits about a two-and-a-half volts drop, and germanium diode 45 is reversely biased by the voltage on collector 46, since the voltage on collector 46 is more negative than the voltage at junction point 47. Since diode 45 is reversely biased, the base circuit of the transistors 42 is isolated from any change in potential occurring on collector 46 and the total flip-flop circuit is stable. Similarly, when diode 52 is reversely biased, the base circuit of diode 43 is isolated from any change in potential occurring on collector 50 and the total flip-flop is stable. The silicon diodes 44 and 51 are used in the described circuit configuration to decrease the total power necessary to operate the flip-flop 4. The use of the several diodes has the further advantage of reducing the effect of noise voltage on the flip-flop circuit 4 when the collector of transistor 42 or 43 is at or near the voltage level corresponding to non-conduction thereof.

When a pulse is applied from current gate 3 to the base of the transistor 42 or 43 that is conducting, that transistor conducts a little more during the occurrence of the clock pulse, but the circuit does not change to its other state. If the clock pulse is applied to the base of the transistor 42 or 43 that is not conducting, that transistor changes its state to the conducting state, and its collector increases in voltage in a positive direction with respect to ground, the other transistor being made non-conducting by this change of voltage which is applied to its base. This complete transition from conduction to non-conduction takes place before the end of the pulse supplied from the current gate 3.

As noted, an output may be taken from each transistor collector 46 and 50 of the flip-flop circuit 4. If the output from flip-flop circuit 4 is applied to further circuits while clock pulses are present, a race problem arises in that the flip-flop in the process of changing conductive states produces pulses at its outputs which may change the relative voltage differential between bases 13 and 31 in another circuit and may cause the output of the strobe circuit 2 to be directed from the base of one transistor 42 or 43 to the base of the other transistor 43 or 42 in the other circuit, resulting in false operation of that flip-flop circuit.

Prior art apparatus for preventing this race condition includes a two-phase clock producing successive pulses, the earlier one triggering the flip-flop and the latter one enabling a further circuit. This prior art arrangement requires a two-phase clock and separate connections from its several outputs. Another prior art method of preventing the undesired race condition is to insert a capacitance resistance-diode gating circuit between the flip-flop output and the further circuit to be controlled. However, such capacitance resistance-diode gates are noise sensitive. In the circuit described herein, a second order time constant circuit is used for coupling each of the outputs of the flip-flop to the further circuit. These time constant circuits, the filter circuits generally indicated at 61 and 62 in the drawing, slow down the change in voltage appearing at output terminals 68 and 71 respectively, sufficiently so that the flip-flop circuit completes its change of state while the outputs remain below (or above) the reference voltage at the base 31 of current-switch transistor 32. That is, the clock pulse ends before either output crosses the reference value of voltage. The manner in which filter circuits 61 and 62 prevent improper operation due to feedback may be explained as follows: the various input signals, which may be applied to input terminals 6, 15 and 16, or any of them, may come from output terminals 68 and 71 of this circuit (or from the outputs of similar circuits). These input signals cause a corresponding voltage state to appear at base 13 of transistor 14 and upon occurrence of a clock pulse, this voltage state will cause direction of a current to one or the other of bases 40 or 41. This current, may, depending on the previous state of the flip-flop circuit 4, change the conduction condition thereof. The output of flip-flop circuit 4, in the absence of filter circuits 61 and 62 may be fed back to the inputs such as 6, 15 and 16 thereby changing the voltage state of base 13 in such a manner as to prevent the completion of the operation of the flip-flop circuit 4, whereby improper operation of the circuit results. Therefore, the delay circuits 61 and 62, which delay the appearance of output voltages from flip-flop circuit 4 at output terminals 68 and 71 until the clock pulse has disappeared thereby prevents the feedback pulse from causing improper operation of the flip-flop circuit. The delayed output pulses from output connections 68 and 71 will however be applied to whatever circuit they may be connected to after the termination of a clock pulse and before the occurrence of the next clock pulse. The delay produced by filter circuits 61 and 62, it is estimated, should be equal to, or more than, the width of the clock pulse. Therefore, upon using such filter circuits 61 and 62, either of outputs 68 or 71 can be connected to its own input or to any other input circuit and a single phase clock pulse may be applied to all circuits without misfunction due to feedback to the current gate 3. A further advantage of the use of these filters is that noise pulses of amplitudes up to slightly less than one-half the amplitude of the input signal do not cause misfunction of the circuit. A still further advantage of these filter circuits arises from the fact that the signals which appear at the output of the filters have a slower rise time than the signals produced by the flip-flop directly, whereby a lesser bandwidth is required for the transmission of the filtered signal. Signals requiring a lesser bandwith are less affected by transients produced in long transmission lines to which the pulse may be applied. Also, any capacitance in the load acts as additional capacitance to that in the filter circuit, rather than being the total amount thereof, whereby the effect of output capacitance on the output wave is reduced.

A circuit has been built that operates up to 30 megacycles per second using the voltages and component values listed below. This list is not intended to be limiting but merely illustrative.

| Voltages: | | |
|---|---|---|
| 10, 55, 56 | +12 | ±5% |
| 18, 36, 67, 70 | −4.5 | ±7% |
| 8, 24, 49, 54 | −16.5 | ±5% |

| Resistors: | Tolerances ±2% |
|---|---|
| **7** | 3,000 |
| **9** | 5,600 |
| **25** | 750 |
| **34, 35** | 300 |
| **48, 55** | 3,600 |
| **57, 58** | 51,000 |
| **64** | 100 |
| **65** | 120 |

| Capacitors: | |
|---|---|
| **20** (if used) | 390 micro-microfarad. |
| **37** | 0.1 microfarad. |
| **66** | 82 micro-microfarad. |

| Inductors: | |
|---|---|
| **63** | 1.5 microhenries. |

| Transistors: | |
|---|---|
| **23** | 2N709. |
| **31** | 2N709. |
| **14** | 2N709. |
| **42** | 2N965 or 2N781. |
| **43** | 2N965 or 2N781. |

What is claimed is:

1. A logic circuit comprising the combination of a diode gate circuit having an output connection, a strobe circuit, a current gate circuit, and a flip-flop circuit having a pair of input connections and a pair of output connections, said strobe circuit comprising an electron device having an input electrode and an output electrode, means for biasing said electron device to cutoff, and means for applying a clock pulse to said input electrode, said current gate circuit comprising a pair of electron devices each having input electrodes and an output electrode, means for connecting a reference voltage to one of the input electrodes of one of said pair of electron devices, means for connecting the output of said diode gate circuit to an input electrode of another of said pair of electron devices, means for coupling the output electrode of said strobe circuit to another input electrode of both of said pair of electron devices, means for taking output voltages from said output connections through individual, passive time constant delay circuits each having a time delay substantially equal to the time of transition of said flip-flop circuit from one stable state to the other stable state, and means for coupling the output electrodes of said electron devices individually to the inputs of said flip-flop circuits.

2. In a logic circuit, a flip-flop circuit comprising a pair of transistors each having an input electrode, an output electrode and a reference electrode, means for connecting each of said reference electrodes to a point of ground potential, means for connecting the input electrode of each of said transistors to the output electrode of the other transistor through a respective connection including two transversely connected diodes in series, one of said two transversely connected diodes having a higher threshold of conduction than the other thereof and a terminal of said one diode being connected to the input electrode of its respective transistor, means for applying voltages in the forward direction to the connections between said two reversely connected diodes, means for applying voltage of the same polarity to the output electrode of each of said transistors through the separate series connection of a pair of time constant filters, one of said filters comprising a resistance and inductance in parallel and the other of said filters comprising a resistor and a capacitor in parallel, and a pair of output terminals for said flip-flop circuit, each output terminal being connected between a different said pair of said filters.

3. A logic circuit comprising the combination of a diode gate circuit having an output connection, a strobe circuit having an output connection, a current gate circuit, and a flip-flop circuit having a pair of input connections, said flip-flop circuit comprising a pair of electron devices, each having an input electrode, an output electrode and a reference electrode, means for connecting each said reference electrode to a point of reference potential, means for connecting an output electrode of each of said pair of electron devices through a respective pair of oppositely poled diodes to the input electrode of the other electron device, means for applying voltages in a forward direction to the connection between each pair of said diodes, a pair of passive time delay networks, means for applying operating voltages to the output electrode of each of said electron devices through a different one of said time delay networks, said current gate circuit comprising a second pair of electron devices each having first and second input electrodes and an output electrode, means for connecting a reference voltage to the first one of the input electrodes of one of said second pair of electron devices, means for connecting the output of said diode gate circuit to the first input electrode of the other one of said second pair of electron devices, means for applying the output of said strobe circuit to the second input electrodes of said second pair of electron devices, means for coupling the output electrodes of said second pair of electron devices individually to the input electrodes of said first pair of electron devices, means for taking output voltages from the separate output electrodes of said flip-flop circuit through at least a portion of the associated said separate time delay networks.

4. In a logic circuit the combination of a diode gate, a current gate, a strobe circuit, and a bistable multivibrator circuit, said diode gate comprising a diode switching circuit having input connections and an output connection, the voltage of which may be varied above and below a reference voltage in accordance with voltages applied to said input connections, said current gate comprising a first pair of transistors having their emitters connected together, means for applying said reference potential to the base of one of said transistors, means for connecting the output of said diode gate to the base of said second transistor, said strobe circuit comprising a third transistor, means for connecting the base of said third transistor to a source of clock pulses, means for connecting the emitter of said third transistor to a voltage source of one polarity through a resistor, through a condenser to a ground, and through a reversely connected diode to a source of less voltage of said one polarity, the collector of said third transistor being connected to the emitters of said first and second transistors, said bistable multivibrator comprising a fourth and fifth transistor, a silicon diode and a germanium diode connected in the order named between the base of the fourth and the collector of the fifth transistor, a further silicon diode and a further germanium diode connected in the order named between the base of the fifth and the collector of the fourth diode, the emitters of said fourth and fifth transistors being connected to a ground, means for connecting a voltage of said one polarity through a resistor to the connection between each silicon diode and the germanium diode connected thereto, said diodes being poled in the current conduction direction with respect to said last named voltage, means for applying lower voltages of said polarity through time delay filter circuits to the collectors of said fourth and fifth transistors, output terminals for said multivibrator being connected to the collectors to said fourth and fifth transistors through at least a portion of said time delay filter circuits, means for connecting a voltage source of opposite polarity through a pair of resistors to the bases of said fourth and fifth transistors, and individual connections from each last-mentioned bases to a respective collector of said first and second transistors.

References Cited by the Examiner

UNITED STATES PATENTS

| | | | |
|---|---|---|---|
| 2,903,606 | 9/1959 | Curtis | 307—88.5 |
| 2,909,678 | 10/1959 | Jensen | 307—88.5 |
| 2,924,725 | 2/1960 | Blair | 307—88.5 |
| 3,067,336 | 12/1962 | Eachus | 307—88.5 |
| 3,114,053 | 12/1963 | Robinson | 307—88.5 |
| 3,131,317 | 4/1964 | Seening Yee | 307—88.5 |
| 3,132,260 | 5/1964 | Gunderson et al. | 307—88.5 |
| 3,134,030 | 5/1964 | Dao | 307—88.5 |

ARTHUR GAUSS, *Primary Examiner.*